(12) United States Patent
Chen

(10) Patent No.: US 7,463,326 B2
(45) Date of Patent: Dec. 9, 2008

(54) TAPE CARRIER PACKAGE AND LIQUID CRYSTAL DISPLAY PANEL

(75) Inventor: Po-Lung Chen, Tao-Yuan Hsien (TW)

(73) Assignee: Chunghwa Picture Tubes, Ltd., Taipei (TW)

( * ) Notice: Subject to any disclaimer, the term of this patent is extended or adjusted under 35 U.S.C. 154(b) by 305 days.

(21) Appl. No.: 11/327,806

(22) Filed: Jan. 6, 2006

(65) Prior Publication Data

US 2007/0058124 A1 Mar. 15, 2007

(30) Foreign Application Priority Data

Sep. 14, 2005 (TW) ............................. 94131642 A

(51) Int. Cl.
*G02F 1/1345* (2006.01)
*G02F 1/136* (2006.01)

(52) U.S. Cl. .................... 349/150; 349/56; 349/58; 349/50; 349/84; 349/139; 349/149; 349/151; 349/152

(58) Field of Classification Search ................... 349/150
See application file for complete search history.

(56) References Cited

U.S. PATENT DOCUMENTS

| 7,067,334 | B2 * | 6/2006 | Cho | ............................. 438/15 |
| 2005/0078459 | A1 * | 4/2005 | Yeon | ........................... 361/749 |

* cited by examiner

*Primary Examiner*—Frank G Font
*Assistant Examiner*—Mary A El Shammaa
(74) *Attorney, Agent, or Firm*—Brooks Kushman P.C.

(57) ABSTRACT

A tape carrier package includes: a flexible substrate having an end portion that is formed with two recesses spaced apart from each other; a plurality of conductive leads provided on the flexible substrate in a manner to form a pin-like contact array on the end portion of the flexible substrate between the recesses in the end portion of the flexible substrate; and an integrated circuit provided on the flexible substrate and coupled to the conductive leads. A liquid crystal display panel includes: a panel body having a contact region; a driver printed circuit board; and a plurality of the aforesaid tape carrier packages. The pin-like contact array of the conductive leads on the end portion of the flexible substrate is connected to the contact region of the panel body and the driver printed circuit board.

10 Claims, 4 Drawing Sheets

TAPE CARRIER PACKAGE AND LIQUID CRYSTAL DISPLAY PANEL

This application claims priority of Taiwanese application no. 094131642, filed on Sep. 14, 2005.

BACKGROUND OF THE INVENTION

1. Field of the Invention

This invention relates to a tape carrier package and a liquid crystal display panel, more particularly to a tape carrier package capable of preventing bending of conductive leads and to a liquid crystal display panel including the tape carrier package.

2. Description of the Related Art

Referring to FIG. 1, a liquid crystal display panel 9 of a thin film transistor liquid crystal display (TFT-LCD) includes a source driver printed circuit board 91, a gate driver printed circuit board 92, a panel body 93 for display purposes, and a plurality of tape carrier packages (TCP) 94, 95 and 96. The source driver printed circuit board 91 and the gate driver printed circuit board 92 are respectively located at a longitudinal side 931 and a transverse side 932 of the panel body 93, and are spaced apart from the panel body 93. Tape carrier packages 94, 95 and 96 are used to electrically connect the panel body 93 to the source driver printed circuit board 91 and the gate driver printed circuit board 92.

FIG. 2 is a rear view illustrating the structure of a conventional tape carrier package 94. The TCP 94 typically includes a substrate 941 made from a flexible film, leads 942 provided on the substrate 941, and a chip 943 mounted on the substrate 941 through a sealant 944 and electrically coupled to the leads 942. The leads 942 are covered with an anti-soldering layer 945 as an insulating layer, except for end portions of the leads 942 near the periphery of the substrate 941 (i.e., contact portions 946 and 947 of the leads 942). The contact portions 946 and 947 of the leads 942 are used to electrically connect an indium tin oxide electrode unit 933 of the panel body 93 to the driver printed circuit boards 91 and 92.

After electrical connection of the panel body 93 and the source driver printed circuit board 91 and the gate driver printed circuit board 92 so as to form a LCD panel 9, the LCD panel 9 is assembled with a back light assembly (not shown), a frame (not shown), and other elements so as to form the liquid crystal display. During assembly, TCPs 95 and 96 located at two ends of the longitudinal side 931 of the panel body 93 tend to be damaged, such that end edges of the contact portions 946 and 947 of the leads 942 of the TCPs 95 and 96 are undesirably bent, thereby resulting in open lines at the two ends of the longitudinal side 931 of the panel body 93.

Some solutions with respect to this bending problem have been proposed heretofore. According to the prior art, as shown in FIG. 2, the contact portions 946 and 947 of the leads 942 are protected by corner portions 948 of the substrate 941 to prevent direct impact from the side of the substrate 941. However, since the contact portions 946 and 947 are directly connected to the corner portions 948 of the substrate 941, they can still be affected indirectly by an external impact acting on the corner portions 948 of the substrate 941.

SUMMARY OF THE INVENTION

Therefore, an object of this invention is to provide a tape carrier package, which can prevent bending of leads on a substrate.

According to one aspect of this invention, there is provided a tape carrier package that comprises: a flexible substrate having two end portions opposite to each other in a direction; each of the end portions including two recesses spaced apart from each other and opening in said direction in an opposite orientation to the two recesses of the other end portion; a plurality of conductive leads provided on the flexible substrate in a manner to form a pin-like contact array on each of the end portions of the flexible substrate between the recesses in the respective one of the end portions of the flexible substrate; and an integrated circuit provided on the flexible substrate and coupled to the conductive leads.

According to another aspect of this invention, there is provided a liquid crystal display panel that comprises: a panel body having a contact region; a driver printed circuit board; and a plurality of tape carrier packages coupling the contact region of the panel body to the driver printed circuit board. Each of the tape carrier packages includes: a flexible substrate having two opposite end portions, each of which is formed with two recesses spaced apart from each other; a plurality of conductive leads provided on the flexible substrate in a manner to form two pin-like contact arrays respectively on the end portions of the flexible substrate, each of the pin-like contact arrays being disposed between the recesses in the respective one of the end portions of the flexible substrate; and an integrated circuit provided on the flexible substrate and coupled to the conductive leads. The pin-like contact arrays of the conductive leads on the end portions of the flexible substrate are connected to the contact region of the panel body and the driver printed circuit board.

BRIEF DESCRIPTION OF THE DRAWINGS

Other features and advantages of the present invention will become apparent in the following detailed description of the preferred embodiments of this invention, with reference to the accompanying drawings, in which.

DETAILED DESCRIPTION OF THE PREFERRED EMBODIMENTS

Figure 1:
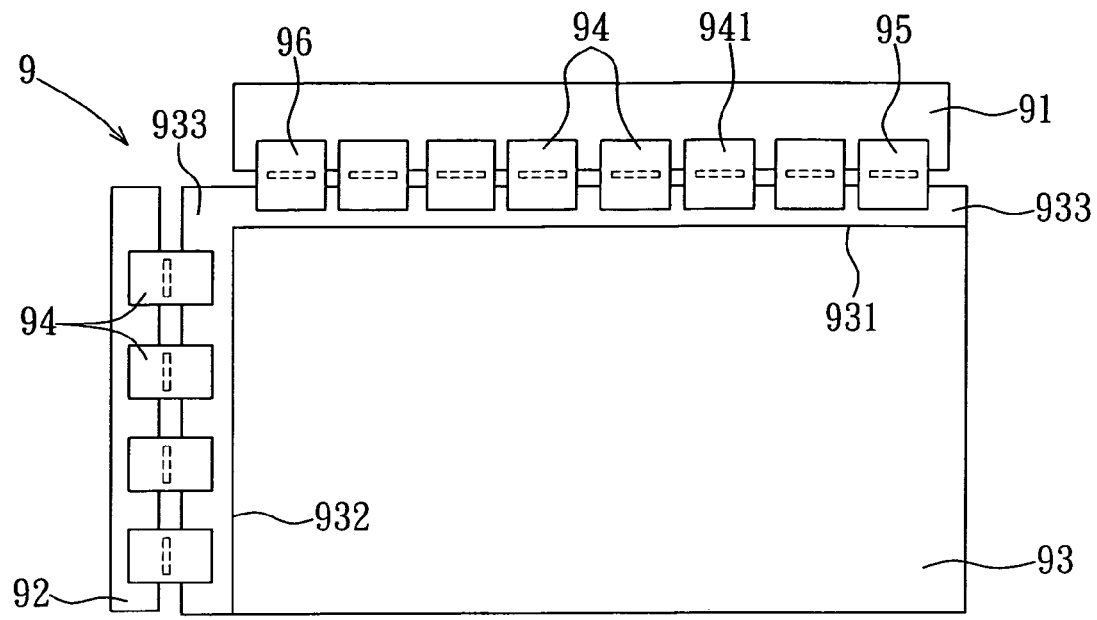
FIG. 1 is a schematic view illustrating the structure of a conventional LCD panel.
Figure 2:
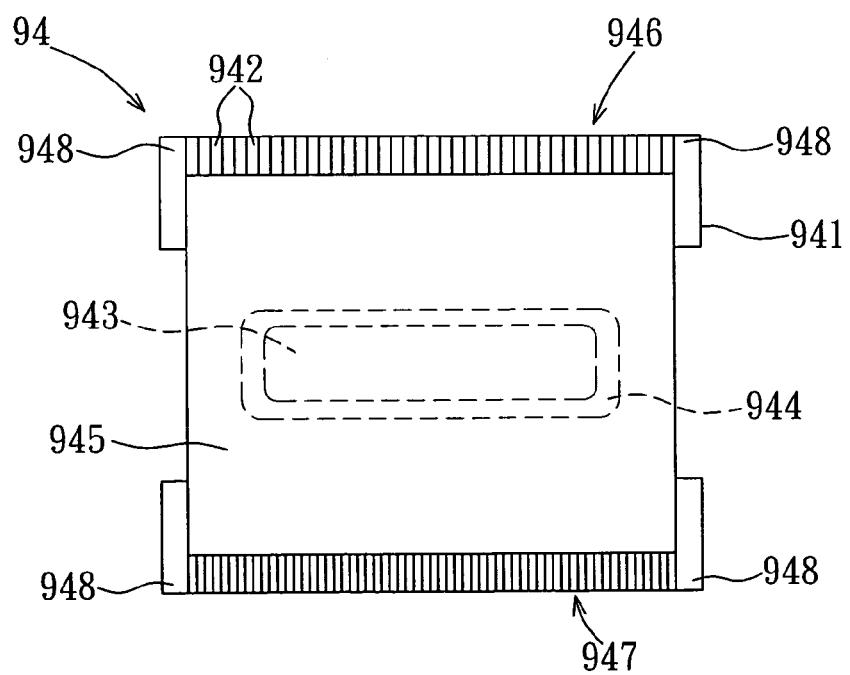
FIG. 2 is a schematic rear view illustrating the structure of a conventional TCP.

Before the present invention is described in greater detail, it should be noted that same reference numerals have been used to denote like elements throughout the specification.

Figure 3:
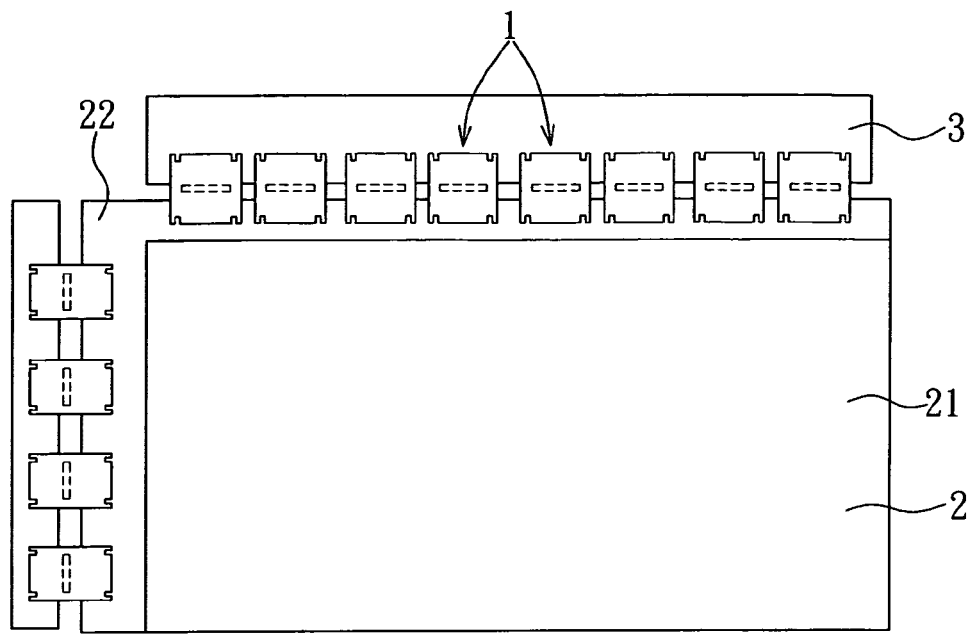
FIG. 3 is a schematic view illustrating the structure of the preferred embodiment of a LCD panel according to this invention.

Referring to FIG. 3, the preferred embodiment of a liquid crystal display panel according to the present invention is shown to include a plurality of tape carrier packages (TCP) 1, a panel body 2, and a driver printed circuit board 3.

The panel body 2 includes a display region 21 and a contact region 22.

Figure 4:
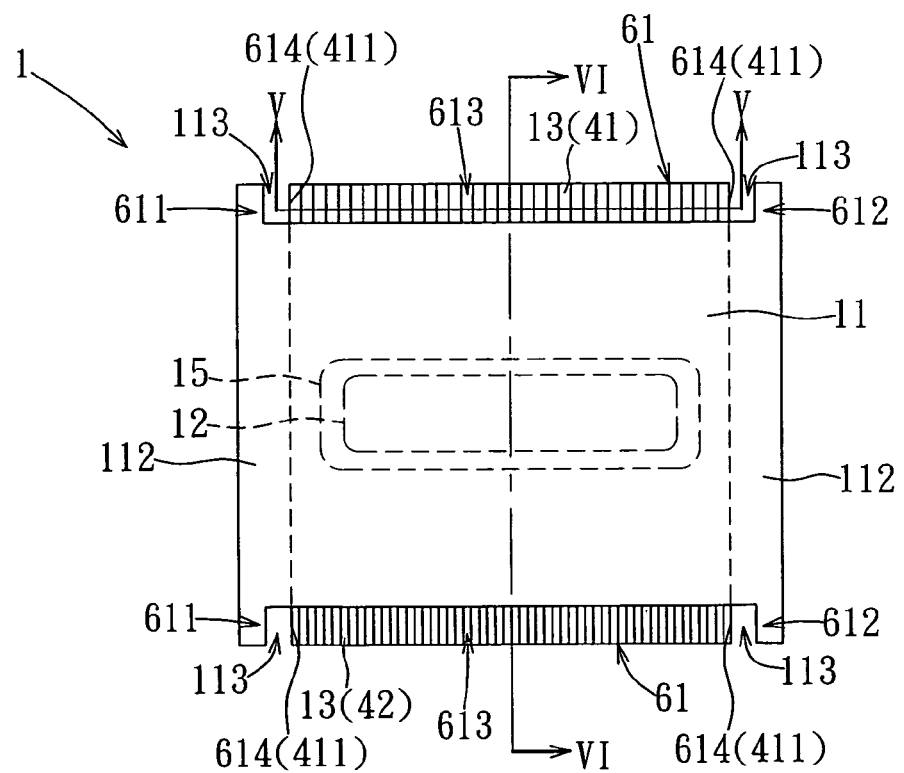
FIG. 4 is a schematic rear view illustrating the structure of a TCP of the first preferred embodiment according to this invention.
Figure 5:
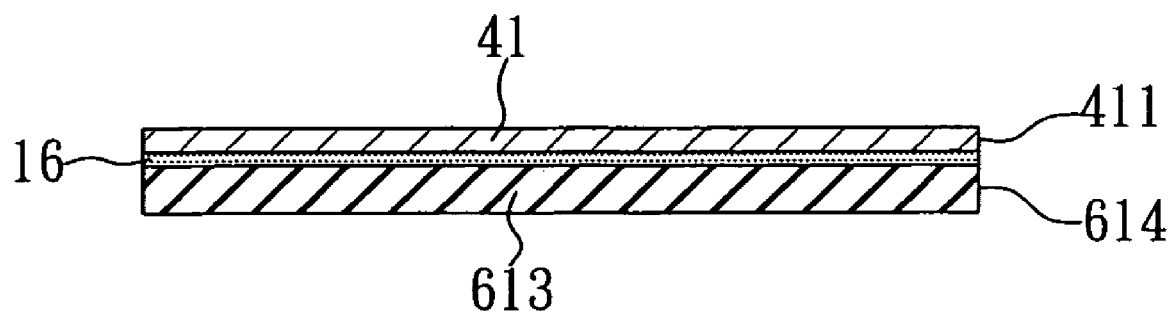
FIG. 5 is a cross-sectional view, taken along line V-V in FIG. 4.
Figure 6:
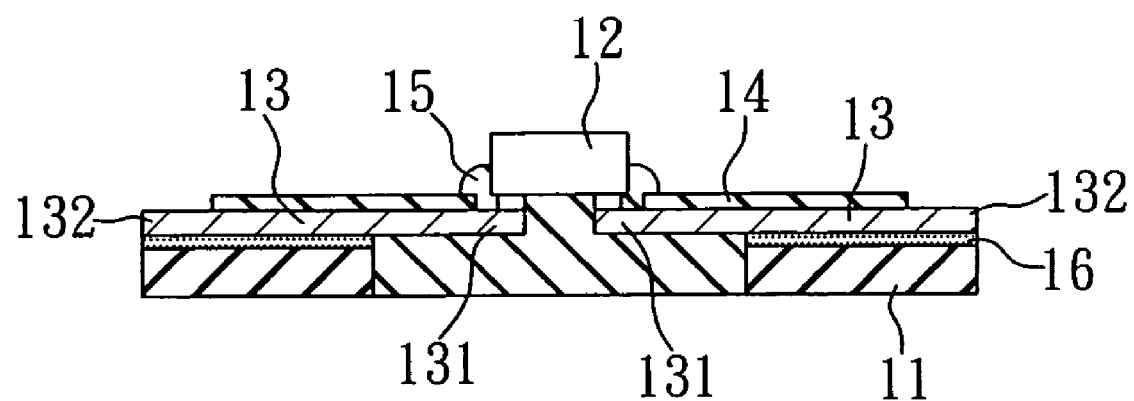
FIG. 6 is a partly cross-sectional view, taken along line VI-VI in FIG. 4.

As shown in FIGS. 4, 5, and 6, each of the tape carrier packages 1 according to the first preferred embodiment of this invention includes a substrate 11, an integrated circuit or a chip 12, and a plurality of conductive leads 13.

The substrate 11 is made from a flexible material, and has two opposite end portions 61, each of which is formed with two recesses 113 spaced apart from each other.

The chip 12 is provided on and is connected to the flexible substrate 11 through a sealant 15, such as an epoxy resin.

The conductive leads 13 are provided on and are fixed to the flexible substrate 11 through an adhesive 16 in a manner to form two pin-like contact arrays 41 and 42 on the end portions 61 of the flexible substrate 11 between the recesses 113 in the end portions 61 of the flexible substrate 11.

In this embodiment, each of the end portions 61 of the flexible substrate 11 has two opposite corner sections 611 and 612 and an intermediate section 613. The intermediate section 613 is disposed between the corner sections 611 and 612, and has two opposite end edges 614 which are separated from the corner sections 611 and 612 by the recesses 113, respectively.

In this embodiment, the pin-like contact arrays 41 and 42 of the conductive leads 13 are formed on the intermediate sections 613 of the end portions 61 of the flexible substrate 11. Each of the pin-like contact arrays 41 and 42 of the conductive leads 13 has two opposite end edges 411 that are flush with the end edges 614 of the intermediate section 613 of the end portion 61 of the flexible substrate 11, respectively.

Figure 7:
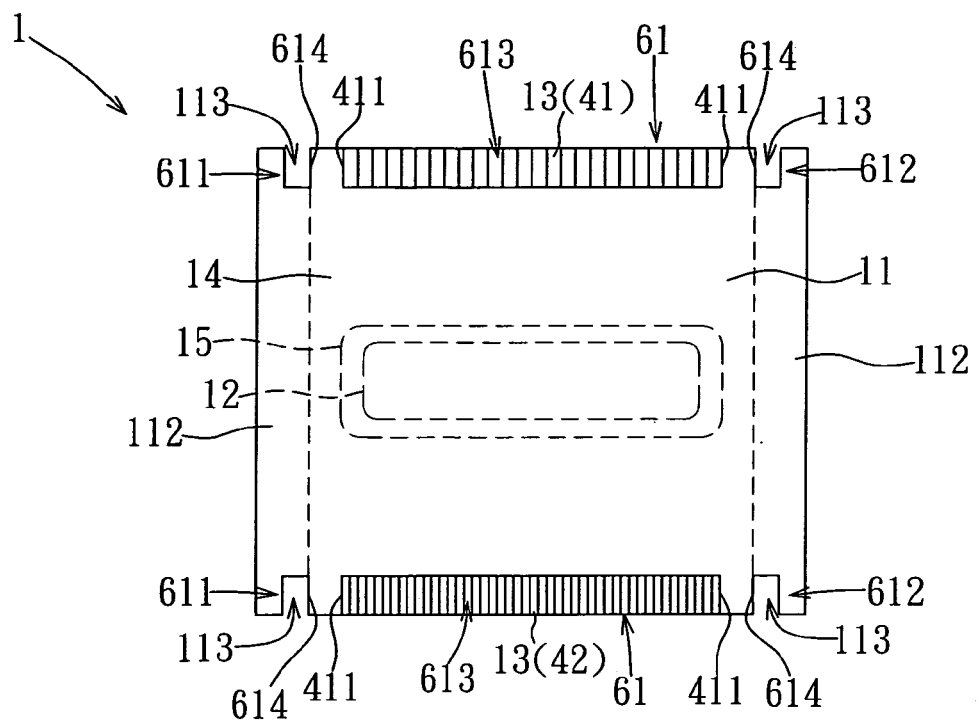
FIG. 7 is a schematic rear view illustrating the structure of a TCP of the second preferred embodiment according to this invention.

FIG. 7 illustrates the second preferred embodiment of a TCP 1 according to this invention, which is a modification of the first preferred embodiment. In this embodiment, each of the pin-like contact arrays 41 and 42 of the conductive leads 13 has two opposite end edges 411 that are offset from the end edges 614 of the intermediate section 613 of the end portion 61 of the flexible substrate 11, respectively.

In the first and second preferred embodiments, the leads 13 are arranged into two arrays disposed at two opposite sides of the substrate 11, and have inner ends 131 electrically coupled to the chip 12, and outer ends 132 that define the pin-like contact arrays 41 and 42. The outer ends 132 of the leads 13 in a first one of the arrays are connected to the driver printed circuit board 3 by an anisotropic conductive film (ACF) or a solder, and are used as signal output terminals. The outer ends 132 of the leads 13 in a second one of the arrays are connected to the contact region 22 of the panel body 2 by an anisotropic conductive film (ACF), and are used as signal input terminals.

Figure 8:
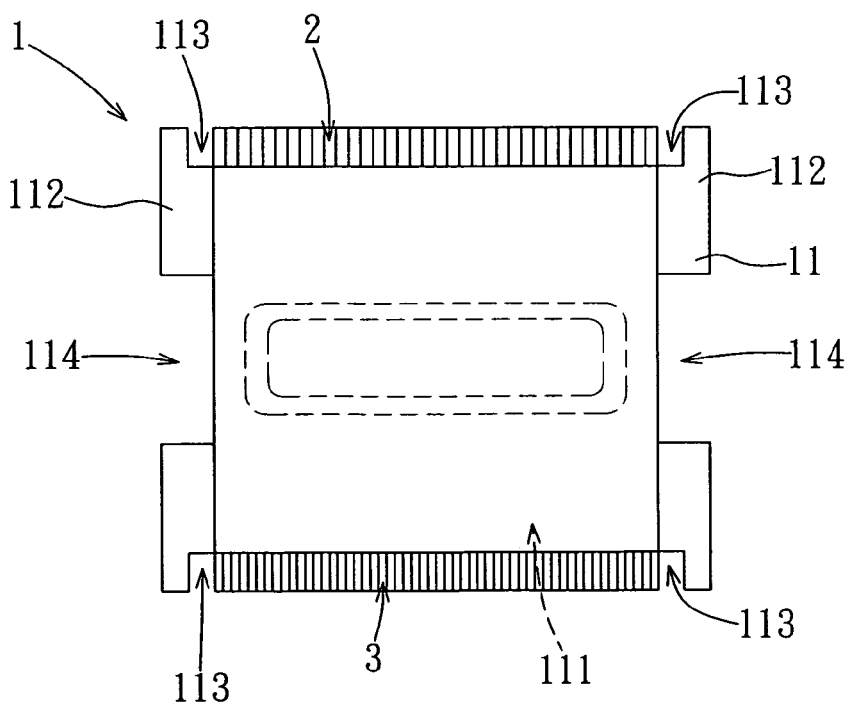
FIG. 8 is a schematic view illustrating the structure of a TCP of the third preferred embodiment according to this invention.

FIG. 8 illustrates the third preferred embodiment of a TCP 1 according to this invention. The TCP 1 of this embodiment differs from the first preferred embodiment in that the flexible substrate 11 of the tape carrier package 1 of this embodiment further has side portions 112 which are perpendicular to the end portions 61 of the substrate 11, and which are formed with cutouts 114. The side portions 112 can be used as dummy areas.

Preferably, the tape carrier package 1 of this invention further includes an anti-soldering layer 14 (see FIG. 6) covering the flexible substrate 11 and a portion of each of the leads 13 to prevent damage from occurring during reflow process. Portions of the leads 13 that are exposed from the anti-soldering layer 14 define the pin-like contact arrays 41 and 42.

Since the recesses 113 formed in the substrate 11 of the TCP 1 protect the pin-like contact arrays 41 and 42 of the leads 13, which are arranged between the recesses 113, from impact and provide a buffer effect when an external impact acts on corners of the substrate 11, the aforesaid drawback with respect to bending of the leads as encountered in the prior art can be eliminated.

While the present invention has been described in connection with what is considered the most practical and preferred embodiments, it is understood that this invention is not limited to the disclosed embodiments but is intended to cover various arrangements included within the spirit and scope of the broadest interpretation and equivalent arrangements.

What is claimed is:

1. A tape carrier package comprising:
   a flexible substrate having two end portions opposite to each other in a direction, each of said end portions having two recesses spaced apart from each other and opening in said direction in an opposite orientation to the two recesses of the other end portion;
   a plurality of conductive leads provided on said flexible substrate in a manner to form a pin-like contact array on each of said end portions of said flexible substrate between said recesses in the respective one of said end portions of said flexible substrate; and
   an integrated circuit provided on said flexible substrate and coupled to said conductive leads.

2. The tape carrier package of claim 1, wherein each of said end portions of said flexible substrate has two opposite corner sections and an intermediate section that is disposed between said corner sections and that has two opposite end edges which are separated from said corner sections by said recesses, respectively, said pin-like contact array of said conductive leads being formed on said intermediate section.

3. The tape carrier package of claim 2, wherein said pin-like contact array of said conductive leads has two opposite end edges that are flush with said end edges of said intermediate section, respectively.

4. The tape carrier package of claim 2, wherein said pin-like contact array of said conductive leads has two opposite end edges that are offset from said end edges of said intermediate section, respectively.

5. The tape carrier package of claim 1, further comprising an anti-soldering layer covering said flexible substrate and a portion of each of said conductive leads.

6. A liquid crystal display panel comprising:
   a panel body having a contact region;
   a driver printed circuit board; and
   a plurality of tape carrier packages coupling said contact region of said panel body to said driver printed circuit board, each of said tape carrier packages including:
   a flexible substrate having two end portions opposite to each other in a direction, each of said end portions having two recesses spaced apart from each other and opening in said direction in an opposite orientation to the two recesses of the other end portion,
   a plurality of conductive leads provided on said flexible substrate in a manner to form two pin-like contact arrays respectively on said end portions of said flexible substrate, each of said pin-like contact arrays being disposed between said recesses in the respective one of said end portions of said flexible substrate, and
   an integrated circuit provided on said flexible substrate and coupled to said conductive leads;
   wherein said pin-like contact arrays of said conductive leads on said end portions of said flexible substrate are connected to said contact region of said panel body and said driver printed circuit board.

7. The liquid crystal display panel of claim 6, wherein each of said end portions of said flexible substrate has two opposite corner sections and an intermediate section that is disposed between said corner sections and that has two opposite end edges which are respectively separated from said corner sections by said recesses in the respective one of said end portions of said flexible substrate, each of said pin-like contact arrays of said conductive leads being respectively formed on said intermediate sections of said end portions of said flexible substrate.

8. The liquid crystal display panel of claim 7, wherein each of said pin-like contact arrays of said conductive leads has two opposite end edges that are flush with said end edges of said intermediate section of the respective one of said end portions of said flexible substrate, respectively.

9. The liquid crystal display panel of claim 7, wherein each of said pin-like contact arrays of said conductive leads has two opposite end edges that are offset from said end edges of said intermediate section of the respective one of said end portions of said flexible substrate, respectively.

10. The liquid crystal display panel of claim 7, wherein each of said tape carrier packages further includes an anti-soldering layer covering said flexible substrate and a portion of each of said conductive leads, the remaining portions of said conductive leads being exposed from said anti-soldering layer and defining said pin-like contact arrays.

* * * * *